(12) United States Patent
Wang et al.

(10) Patent No.: US 11,543,651 B2
(45) Date of Patent: Jan. 3, 2023

(54) MICROMACHINED MIRROR ASSEMBLY WITH ASYMMETRIC STRUCTURE

(71) Applicant: BEIJING VOYAGER TECHNOLOGY CO., LTD., Beijing (CN)

(72) Inventors: Youmin Wang, Berkeley, CA (US); Yufeng Wang, Palo Alto, CA (US); Qin Zhou, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 432 days.

(21) Appl. No.: 16/702,519

(22) Filed: Dec. 3, 2019

(65) Prior Publication Data

US 2021/0165210 A1 Jun. 3, 2021

(51) Int. Cl.
*G02B 26/08* (2006.01)
*G02B 26/10* (2006.01)
*G01S 7/481* (2006.01)
*B81B 3/00* (2006.01)

(52) U.S. Cl.
CPC ........ *G02B 26/0841* (2013.01); *B81B 3/0048* (2013.01); *G01S 7/4817* (2013.01); *G02B 26/0858* (2013.01); *G02B 26/105* (2013.01); *B81B 2201/033* (2013.01); *B81B 2201/042* (2013.01)

(58) Field of Classification Search
CPC ............ G02B 26/0841; G02B 26/0858; G02B 26/105; G02B 26/0833; B81B 3/0048; B81B 2201/033; B81B 2201/042; G01S 7/4817; G01S 7/4814; G01S 17/931
USPC ........................................................ 356/4.01
See application file for complete search history.

(56) References Cited

U.S. PATENT DOCUMENTS

2006/0082251 A1* 4/2006 He .................... H02N 1/006
310/309
2018/0321037 A1* 11/2018 Wen ................... G01C 19/5719

* cited by examiner

*Primary Examiner* — Euncha P Cherry
(74) *Attorney, Agent, or Firm* — Bayes PLLC

(57) ABSTRACT

Embodiments of the disclosure provide a micromachined mirror assembly for controlling optical directions in an optical sensing system. The micromachined mirror assembly may include a micro mirror configured to direct an optical signal into a plurality of directions. The micromachined mirror assembly may also include at least one actuator coupled to the micro mirror and configured to drive the micro mirror to tilt around an axis. The micromachined mirror assembly may further include one or more objects attached to the micro mirror. The one or more objects may be asymmetrically disposed with respect to the axis to create an imbalanced state of the micro mirror when the micro mirror is not driven by the at least one actuator.

20 Claims, 7 Drawing Sheets

MICROMACHINED MIRROR ASSEMBLY WITH ASYMMETRIC STRUCTURE

TECHNICAL FIELD

The present disclosure relates to optical sensing systems such as a light detection and ranging (LiDAR) system, and more particularly to, a micromachined mirror assembly for controlling optical directions in such an optical sensing system.

BACKGROUND

Optical sensing systems such as LiDAR systems have been widely used in autonomous driving and/or for producing high-definition maps. For example, a typical LiDAR system measures the distance to a target by illuminating the target with pulsed laser light beams and measuring the reflected pulses with a sensor such as a photodetector or a photodetector array. Differences in laser light return times, wavelengths, and/or phases can then be used to construct digital three-dimensional (3D) representations of the target. Because using a narrow laser beam as the incident light can map physical features with very high resolution, a LiDAR system is particularly suitable for applications such as sensing in autonomous driving and high-definition map surveys.

The pulsed laser light beams emitted by a LiDAR system are typically directed to multiple directions to cover a field of view (FOV). Various methods can be used to control the directions of the pulsed laser light beams. Existing LiDAR systems generally use electrostatic-, piezoelectric-, or magnetic-based actuators (e.g., electrostatic actuators, piezoelectric actuators, magnetic actuators, etc.) to drive an optical component, such as a mirror, in the LiDAR systems to direct the pulsed laser light beams to the surrounding environment when the mirror is oscillating back and forth. One drawback of driving the mirror using electrostatic, piezoelectric, or magnetic actuators is that it is not easy to break the initial balance of the mirror to start oscillating because the actuating force provided by such actuators tends to hold the balanced mirror stationary. Typically, the initiation of the oscillating motion relies on an external disturbance (e.g., randomly occurred) to break the balanced state. As a result, it is challenging to archive high speed initiation of the oscillating motion of the mirror.

Embodiments of the disclosure improve the speed of initiating the oscillating motion of the mirror by providing a micromachined mirror assembly with asymmetric structure.

SUMMARY

Embodiments of the disclosure provide a micromachined mirror assembly for controlling optical directions in an optical sensing system. The micromachined mirror assembly includes a micro mirror, at least one actuator, and one or more objects attached to the mirror. The micro mirror is configured to direct an optical signal into a plurality of directions. The at least one actuator is coupled to the micro mirror and is configured to drive the micro mirror to tilt around an axis. The one or more objects are asymmetrically disposed with respect to the axis to create an imbalanced state of the micro mirror when the micro mirror is not driven by the at least one actuator.

Embodiments of the disclosure also provide a method for controlling a micromachined mirror assembly in an optical sensing system. The method includes providing, in the micromachined mirror assembly, a micro mirror for directing an optical signal into a plurality of directions. The method also includes providing at least one actuator coupled to the micro mirror for driving the micro mirror to tilt around an axis. The method further includes providing one or more objects attached to the micro mirror. The one or more objects are asymmetrically disposed with respect to the axis to create an imbalanced state of the micro mirror when the micro mirror is not driven by the at least one actuator. In addition, the method includes applying, by the at least one actuator, force to the imbalanced micro mirror to initiate tilting motion of the micro mirror.

Embodiments of the disclosure further provide an optical sensing system. The optical sensing system includes a transmitter, a receiver, and a mirror assembly. The transmitter is configured to emit an optical signal to scan an environment around the optical sensing system. The receiver is configured to detect a reflected optical signal from the environment. The mirror assembly is configured to control directions of the optical signal. The mirror assembly includes a micro mirror, at least one actuator, and one or more objects attached to the micro mirror. The micro mirror is configured to direct the optical signal into a plurality of directions. The at least one actuator is coupled to the micro mirror and is configured to drive the micro mirror to tilt around an axis. The one or more objects are asymmetrically disposed with respect to the axis to create an imbalanced state of the micro mirror when the micro mirror is not driven by the at least one actuator.

It is to be understood that both the foregoing general description and the following detailed description are exemplary and explanatory only and are not restrictive of the invention, as claimed.

DETAILED DESCRIPTION

Figure 1:
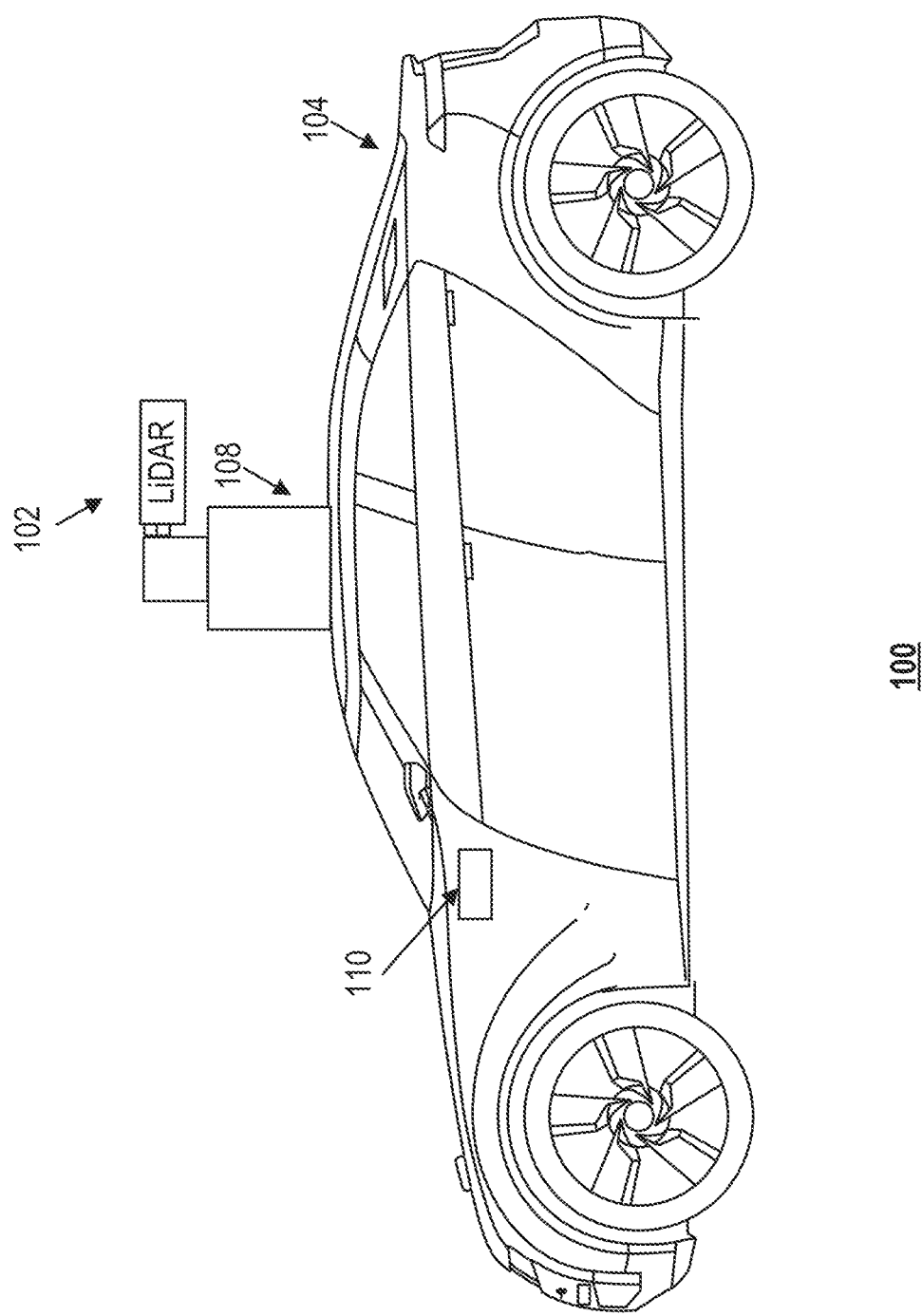
FIG. 1 illustrates a schematic diagram of an exemplary vehicle equipped with a LiDAR system, according to embodiments of the disclosure.

Reference will now be made in detail to the exemplary embodiments, examples of which are illustrated in the accompanying drawings. Wherever possible, the same reference numbers will be used throughout the drawings to refer to the same or like parts.

Embodiments of the present disclosure provide systems and methods for controlling optical directions in an optical sensing system (e.g., a LiDAR system) using a mirror assembly having a mirror that is configured to direct an optical signal into a plurality of directions. The mirror is driven by at least one actuator to tilt certain angles along an axis, thereby directing (e.g., guiding, reflecting, refracting, inflecting, deflecting, and/or diffracting) incident laser beams from a laser source towards certain directions to, for example, scan an environment around the optical sensing system within an FOV. The mirror can be a single micro mirror, or an array of micro mirrors integrated into the mirror assembly, which can be made from semiconductor materials using microelectromechanical system (MEMS) technologies. Such a mirror assembly is also referred to an a micromachined mirror assembly. Micro mirrors in a micromachined mirror assembly are often driven by electrostatic and/or magnetic actuators. In the case of a micro mirror driven by one or more electrostatic actuators, for example, the driving force is an electric force pulling or attracting the micro mirror, often through a comb structure at the mirror edge, toward another comb structure on a stationary structure of each actuator. When the micro mirror is in motion, the pulling/attracting force can maintain or even amplify the motion, thereby driving the micro mirror to oscillate (e.g., tilting along an axis back and forth). However, when the micro mirror is still and positioned in a balanced state with respect to the oscillating axis, the pulling/attracting force generated by the actuators, often in pairs, cancel each other and therefore is unable to initiate the oscillation motion. Usually, the initiation of the motion relies on some external disturbance (e.g., naturally occurred, for example due to random thermal noise or vibration) to create an imbalanced state of the micro mirror, followed by a start-up process for the motion to ramp up gradually, causing slow responsiveness. A similar issue is also present in the case of micro mirrors driven by piezoelectric or magnetic actuators. Embodiments of the present disclosure address these problems by providing a micromachined mirror assembly using a micro mirror with one or more objects attached to the micro mirror to create an imbalanced state of the micro mirror when the micro mirror is not driven by the actuator (s). The introduction of the objects breaks the initial balance by purposefully creating an initial disturbance (e.g., in the form of an initial movement or displacement) to the micro mirror, rather than relying on a naturally occurring event that is unpredictable and unreliable. Thus, the micro mirror disclosed in the present application is much easier and faster to enter the oscillation mode than their conventional counterparts.

Embodiments of the present disclosure can improve the performance of an optical sensing system, which can be used in many applications. For example, the improved optical sensing system can be used in autonomous driving or high-definition map survey, in which the optical sensing system can be equipped on a vehicle.

FIG. 1 illustrates a schematic diagram of an exemplary vehicle 100 equipped with an optical sensing system (e.g., a LiDAR system) 102 (hereinafter also referred to as LiDAR system 102), according to embodiments of the disclosure. Consistent with some embodiments, vehicle 100 may be a survey vehicle configured for acquiring data for constructing a high-definition map or 3-D buildings and city modeling. Vehicle 100 may also be an autonomous driving vehicle.

As illustrated in FIG. 1, vehicle 100 may be equipped with LiDAR system 102 mounted to a body 104 via a mounting structure 108. Mounting structure 108 may be an electromechanical device installed or otherwise attached to body 104 of vehicle 100. In some embodiments of the present disclosure, mounting structure 108 may use screws, adhesives, or another mounting mechanism. Vehicle 100 may be additionally equipped with a sensor 110 inside or outside body 104 using any suitable mounting mechanisms. Sensor 110 may include sensors used in a navigation unit, such as a Global Positioning System (GPS) receiver and one or more Inertial Measurement Unit (IMU) sensors. It is contemplated that the manners in which LiDAR system 102 or sensor 110 can be equipped on vehicle 100 are not limited by the example shown in FIG. 1 and may be modified depending on the types of LiDAR system 102 and sensor 110 and/or vehicle 100 to achieve desirable 3D sensing performance.

Consistent with some embodiments, LiDAR system 102 and sensor 110 may be configured to capture data as vehicle 100 moves along a trajectory. For example, a transmitter of LiDAR system 102 may be configured to scan the surrounding environment. LiDAR system 102 measures distance to a target by illuminating the target with pulsed laser beam and measuring the reflected pulses with a receiver. The laser beam used by LiDAR system 102 may be ultraviolet, visible, or near infrared. In some embodiments of the present disclosure, LiDAR system 102 may capture point clouds including depth information of the objects in the surrounding environment. As vehicle 100 moves along the trajectory, LiDAR system 102 may continuously capture data. Each set of scene data captured at a certain time range is known as a data frame.

Figure 2:
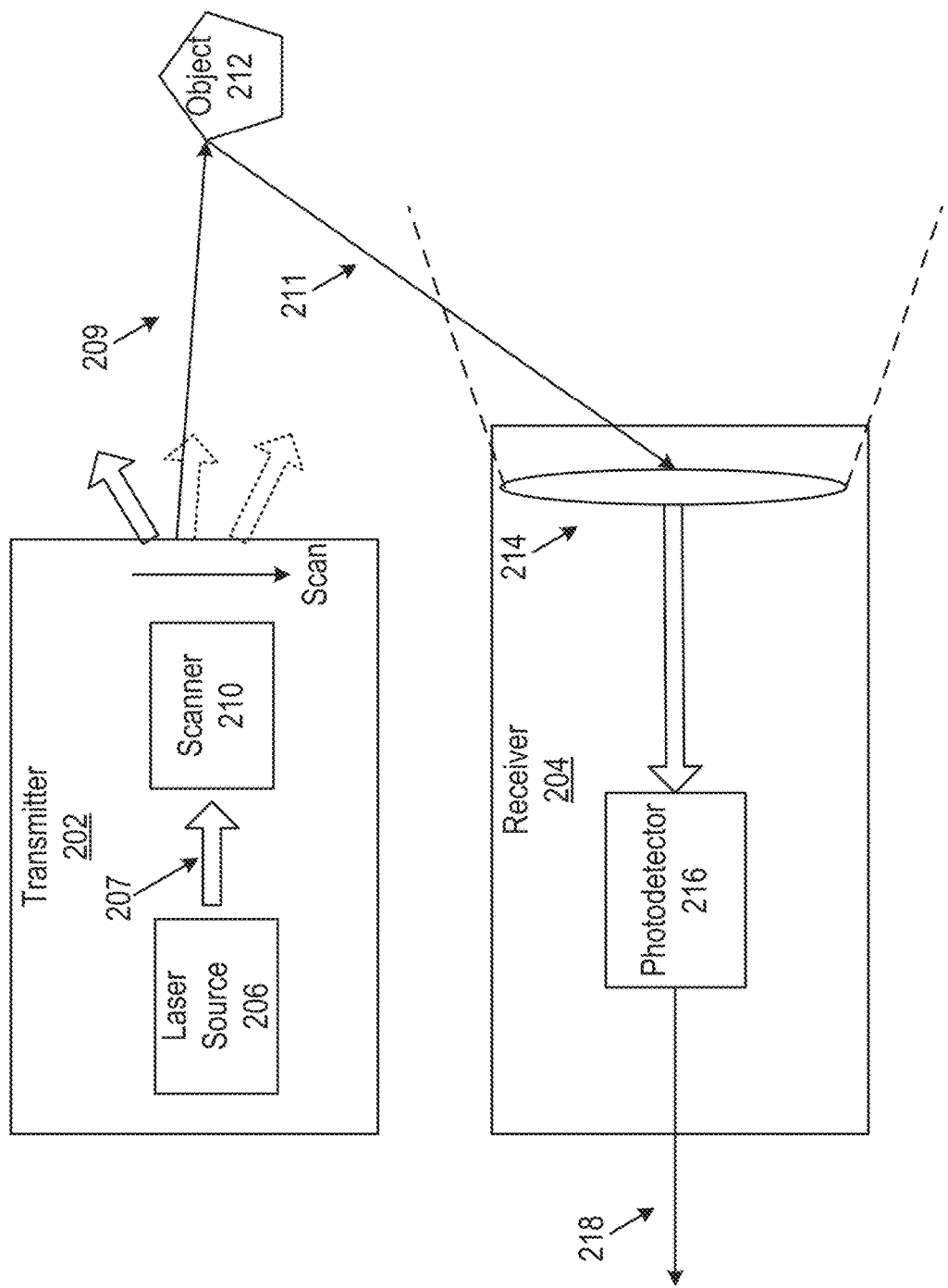
FIG. 2 illustrates a block diagram of an exemplary LiDAR system, according to embodiments of the disclosure.

FIG. 2 illustrates a block diagram of an exemplary LiDAR system 102, according to embodiments of the disclosure. LiDAR system 102 may include a transmitter 202 and a receiver 204. Transmitter 202 may emit laser beams along multiple directions. Transmitter 202 may include one or more laser sources 206 and a scanner 210. As will be described below in greater detail, scanner 210 may include a micromachined mirror assembly having a micro mirror driven by one or more actuators.

Transmitter 202 can sequentially emit a stream of pulsed laser beams in different directions within a scan range (e.g., a range in angular degrees), as illustrated in FIG. 2. Laser source 206 may be configured to provide a laser beam 207 (also referred to as "native laser beam") to scanner 210. In some embodiments of the present disclosure, laser source 206 may generate a pulsed laser beam in the ultraviolet, visible, or near infrared wavelength range.

In some embodiments of the present disclosure, laser source 206 may include a pulsed laser diode (PLD), a vertical-cavity surface-emitting laser (VCSEL), a fiber laser, etc. For example, a PLD may be a semiconductor device similar to a light-emitting diode (LED) in which the laser beam is created at the diode's junction. In some embodiments of the present disclosure, a PLD includes a PIN diode in which the active region is in the intrinsic (I) region, and the carriers (electrons and holes) are pumped into the active region from the N and P regions, respectively. Depending on the semiconductor materials, the wavelength of incident laser beam 207 provided by a PLD may be smaller than 1,100 nm, such as 405 nm, between 445 nm and 465 nm, between 510 nm and 525 nm, 532 nm, 635 nm, between 650 nm and 660 nm, 670 nm, 760 nm, 785 nm, 808 nm, or 848 nm. It is understood that any suitable laser source may be used as laser source 206 for emitting laser beam 207.

Scanner 210 may be configured to emit a laser beam 209 to an object 212 in a first direction. Object 212 may be made of a wide range of materials including, for example, non-metallic objects, rocks, rain, chemical compounds, aerosols, clouds and even single molecules. The wavelength of laser beam 209 may vary based on the composition of object 212. In some embodiments, at each time point during the scan, scanner 210 may emit laser beam 209 to object 212 in a direction within a range of scanning angles by rotating the micromachined mirror assembly. In some embodiments of the present disclosure, scanner 210 may also include optical components (e.g., lenses, mirrors) that can focus pulsed laser light into a narrow laser beam to increase the scan resolution and the range to scan object 212.

In some embodiments, receiver 204 may be configured to detect a returned laser beam 211 returned from object 212. The returned laser beam 211 may be in a different direction from beam 209. Receiver 204 can collect laser beams returned from object 212 and output electrical signals reflecting the intensity of the returned laser beams. Upon contact, laser light can be reflected by object 212 via backscattering, such as Rayleigh scattering, Mie scattering, Raman scattering, and fluorescence. As illustrated in FIG. 2, receiver 204 may include a lens 214 and a photodetector 216. Lens 214 may be configured to collect light from a respective direction in its field of view (FOV). At each time point during the scan, returned laser beam 211 may be collected by lens 214. Returned laser beam 211 may be returned from object 212 and have the same wavelength as laser beam 209.

Photodetector 216 may be configured to detect returned laser beam 211 returned from object 212. In some embodiments, photodetector 216 may convert the laser light (e.g., returned laser beam 211) collected by lens 214 into an electrical signal 218 (e.g., a current or a voltage signal). Electrical signal 218 may be generated when photons are absorbed in a photodiode included in photodetector 216. In some embodiments of the present disclosure, photodetector 216 may include a PIN detector, a PIN detector array, an avalanche photodiode (APD) detector, a APD detector array, a single photon avalanche diode (SPAD) detector, a SPAD detector array, a silicon photo multiplier (SiPM/MPCC) detector, a SiPM/MPCC detector array, or the like.

While scanner 210 is described as part of transmitter 202, it is understood that in some embodiments, scanner 210 can be part of receiver 204, e.g., before photodetector 216 in the light path. The inclusion of scanner 210 in receiver can ensure that photodetector 216 only captures light, e.g., returned laser beam 211 from desired directions, thereby avoiding interferences from other light sources, such as the sun and/or other LiDAR systems. By increasing the aperture of mirror assembly in scanner 210 in receiver 204, the sensitivity of photodetector 216 can be increased as well.

Figure 3A:
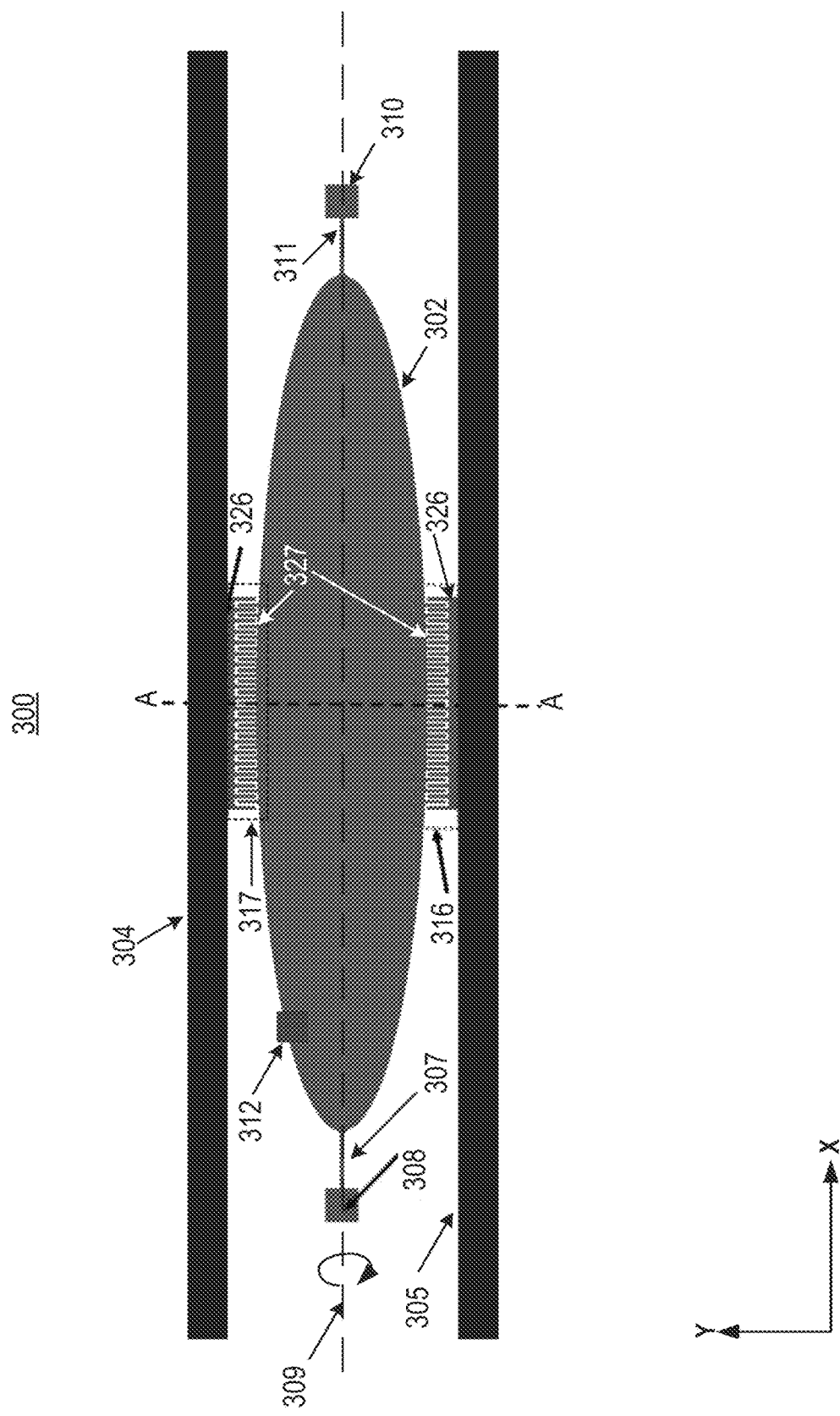
FIG. 3A illustrates a schematic diagram of an exemplary micromachined mirror assembly, according to embodiments of the disclosure.

Conventional micro mirrors used in a LiDAR system have a symmetric structure. For example, the weights of the portions of such a micro mirror on the opposite sides of the tilting axis are generally the same. Thus, a conventional micro mirror is initially in a balanced state with respect to the tilting axis when no actuation force is applied. However, from the balanced state, it is not easy to start the oscillation motion using the pulling/attracting force provided by, for example, a pair of electrostatic or magnetic actuators due to the cancellation effect discussed above. On the other hand, it is much easier to start the oscillation motion using the pulling/attracting force when a micro mirror is in an imbalanced state. The imbalanced state can be established by introducing asymmetry into the structure of the micro mirror or other components of the micromachined mirror assembly. FIG. 3A illustrates a schematic diagram of an exemplary micromachined mirror assembly 300 having an object 312 attached to a micro mirror 302 to create such an imbalanced state, according to embodiments of the disclosure.

Referring to FIG. 3A, micro mirror 302 is configured to tilt around a rotation axis 309 (also referred to as axis 309).

Different from conventional micro mirrors that have a symmetric structure, micro mirror 302 has an object 312 attached to it in an asymmetric manner. For example, object 312 may be disposed on an edge of micro mirror 302, off axis 309. The weight of object 312 may cause micro mirror 302 to slightly lean toward the direction of object 312 (e.g., upper left in the example shown in FIG. 3A), thereby creating an imbalanced state of micro mirror 302 when no actuation force is applied thereon (e.g., when micro mirror 302 is not yet driven by any actuator). It is to be understood that there could be more than one objects attached to micro mirror 302, as long as these objects are distributed asymmetrically with respect to axis 309.

As illustrated in FIG. 3A, micromachined mirror assembly 300 may include a pair of actuators 316 and 317. Each actuator may include a stator 326 supported by a respective supporting structure 304 or 305, and a rotor 327 that can move in a rotational manner with respect to axis 309 (e.g., moving into or out of the paper surface when seen from the top view shown in FIG. 3A). Both stator 326 and rotor 327 may have a comb structure including a plurality of teeth. The teeth of stator 326 and the teeth of rotor 327 may be interleaved but not in physical contact among one another. A first beam 307 may be mechanically coupled to one side of micro mirror 302, and a second beam 311 may be mechanically coupled to the opposite side of micro mirror 302. Micro mirror 302 may be suspended over a substrate 320 (FIG. 3B) by beams 307 and 311 to allow limited movement. For example, micro mirror 302 may be configured to tilt along axis 309. Axis 309 may be defined by beams 307 and 311, as micro mirror 302 may tilt due to the rotation of beams 307 and 311. Micromachined mirror assembly 300 may further include first and second anchors 308 and 310, each mechanically coupled to a respective end of beam 307/311 that is farther away from micro mirror 302 and along axis 309. The other end of beam 307/311 is mechanically coupled to micro mirror 302. In some embodiments, axis 309 may be defined by anchors 308 and 310, for example along a straight line passing through both anchors 308 and 310. In some embodiments, micro mirror 302 may be covered by a reflective layer disposed on its top surface (e.g., facing incident laser beam(s)). The reflective layer may form a reflective surface to reflect an incident laser beam, thereby forming a reflected laser beam. By tilting micro mirror 302 to a different angle, the incident laser beam may be reflected to a different direction, forming another reflected laser beam. It is noted that although micro mirror 302 is in an eclipse shape as shown in FIG. 3A, the shape of micro mirror 302 is not limited to an eclipse shape, and may vary in other examples, such as a square, round, or rectangular shape.

When actuator 316 or 317 receives an electrical signal (e.g., a voltage signal or a current signal) at, for example, stator 326, the electrical signal may cause stator 326 to impose, through the plurality of teeth, an attracting force to the interleaved teeth of rotor 327. When micro mirror 302 is stationary and in a balanced state with respect to axis 309, the attracting force cannot set micro mirror 302 in motion. The balanced state needs to be broken by an external disturbance, which initiates a small motion or displacement of micro mirror 302. After that, the attracting force can amplify the motion/displacement to start the oscillation.

Embodiments of the present disclosure purposefully create such an imbalanced state using objects attached to micro mirror 302, such that the attracting force generated by actuator 316/317 upon receiving the electrical signal can instantly cause the oscillating motion of micro mirror 302.

Figure 3B:
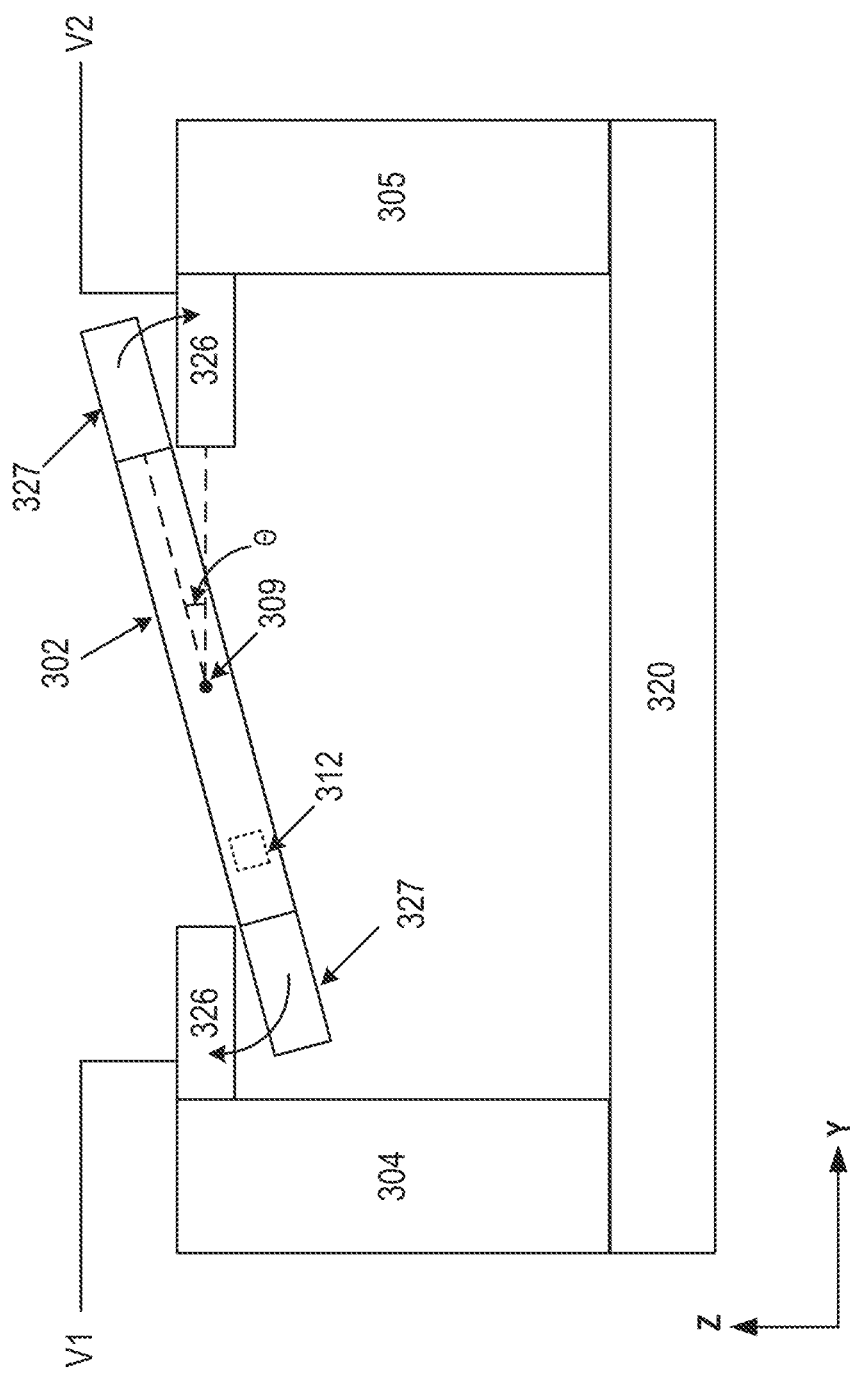
FIG. 3B illustrates a section view along line A-A of the exemplary micromachined mirror assembly in FIG. 3A, according to embodiments of the disclosure.

An exemplary imbalanced state is shown in FIG. 3B, in which a section view along line A-A of micromachined mirror assembly 300 in FIG. 3A is illustrated. As shown in FIG. 3B, object 312, shown as a dashed-line square, is disposed toward the left side of micro mirror 302. The weight of object 312 drags the left side of micro mirror 302 down, thereby creating an imbalanced state with respect to axis 309. This imbalanced state does not depend on whether any actuation force is applied to micro mirror 302. Therefore, micro mirror 302 can be kept in the imbalanced state when micro mirror 302 is not driven by actuator 316/317 (e.g., when no electrical signal is applied to stator 326). During the process of starting the oscillation motion of micro mirror 302, one or more electrical signals (e.g., V1, V2, etc.) may be applied to stator 326, creating an attracting force pulling rotor 327 toward stator 326, thereby instantly causing the rotational motion of micro mirror 302. Once micro mirror 302 is set in motion, rotor 327 can move toward stator 326 and then pass through stator 326 due to their interleaved, non-contacting teeth of the comb structure. After that, rotor 327 may continue swinging to a max angle, during which time electrical signal V1 and/or V2 may be removed to prevent the counter effect of the attracting force. Then the electrical signal may be reapplied, causing the attracting force to pull rotor 327 back toward stator 326. In this way, micro mirror 302 can start the oscillating motion tilting around axis 309 without relying on external disturbances that are unpredictable and unreliable.

In some embodiments, the imbalanced state may be characterized or quantified by an initial tilting angle θ. As shown in FIG. 3B, initial tilting angle θ may be defined by the horizontal plane and the plane containing micro mirror 302. The larger the angle, the more "imbalanced" the micro mirror is. In some embodiments, initial tilting angle θ may be larger than a predetermined threshold, such as 0.5 degree, 1 degree, 2 degrees, 5 degrees, etc.

Figure 3C:
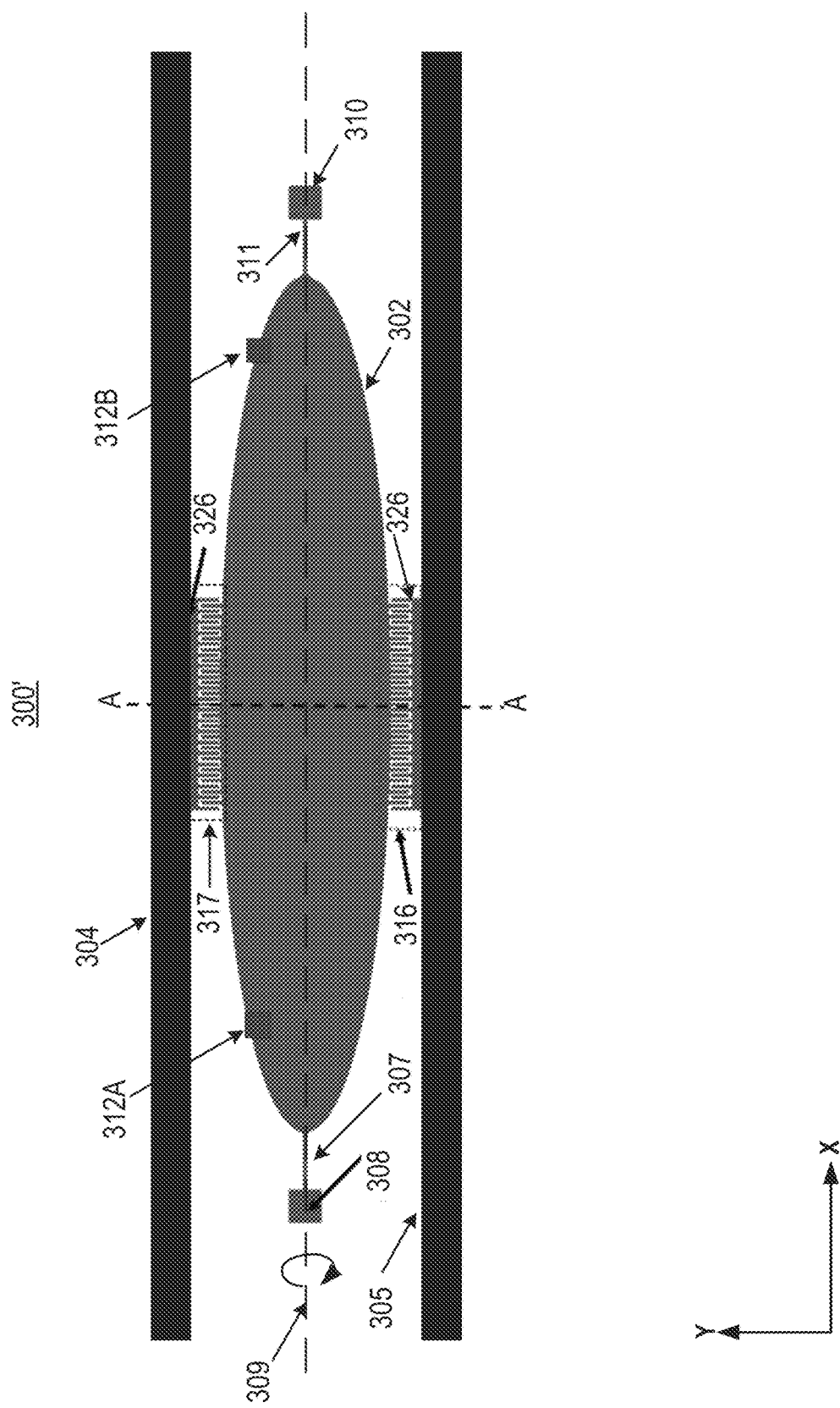
FIG. 3C illustrates a schematic diagram of another exemplary micromachined mirror assembly, according to embodiments of the disclosure.

It is to be noted that the structure that creates the imbalanced state is not limited to the structure shown in FIGS. 3A and 3B. For instance, when a single object is used, the object can be attached to any appropriate place of micro mirror 302 to establish the imbalanced state (e.g., causing initial tilting angle θ to be larger than a threshold). In another example, multiple objects may be used. The multiple objects may be distributed asymmetrically with respect to axis 309 to create an imbalanced state of micro mirror 302. FIG. 3C illustrates a schematic diagram of an exemplary micromachined mirror assembly 300' having multiple objects attached to micro mirror 302. As shown in FIG. 3C, two objects 312A and 312B are distributed around a perimeter of micro mirror 302. In some embodiments, objects 312A and 312B may be disposed symmetrically with respect to the vertical center line A-A of micro mirror 302 to minimize potential distortion of the tilting motion after micro mirror 302 starts to oscillate. On the other hand, they are disposed asymmetrically with respect to axis 309. Because of the asymmetry, objects 312A and 312B may create an imbalanced state in which micro mirror 302 tilts inward (against the paper surface) on the upper part and outward (against the paper surface) on the lower part.

In some embodiments, objects 312A and 312B may have the same weight, size, and/or composition such that the imbalanced effect created by each individual object is substantially the same. As discussed above, objects 312A and 312B may be disposed symmetrically with respect to a non-rotation axis (e.g., A-A) such that both the left and right sides of the upper part of micro mirror 302 tilt substantially the same extent in the imbalanced state. This may minimize the distortion of the tilting motion induced by the objects during regular operation of micro mirror 302.

In some embodiments, objects 312A and 312B may have different weights, sizes, and/or compositions. These differences between objects 312A and 312B may allow flexibility in the placement and distribution of the objects to archive desired design objectives and/or performance requirements.

It is to be understood that the number of objects shown in FIGS. 3A and 3B is illustrative, and there could be more objects attached to micro mirror 302, as long as they are asymmetrically distributed with respect to axis 309 to create an imbalanced state of micro mirror 302 when micro mirror 302 is not driven by an actuator.

Figure 3D:
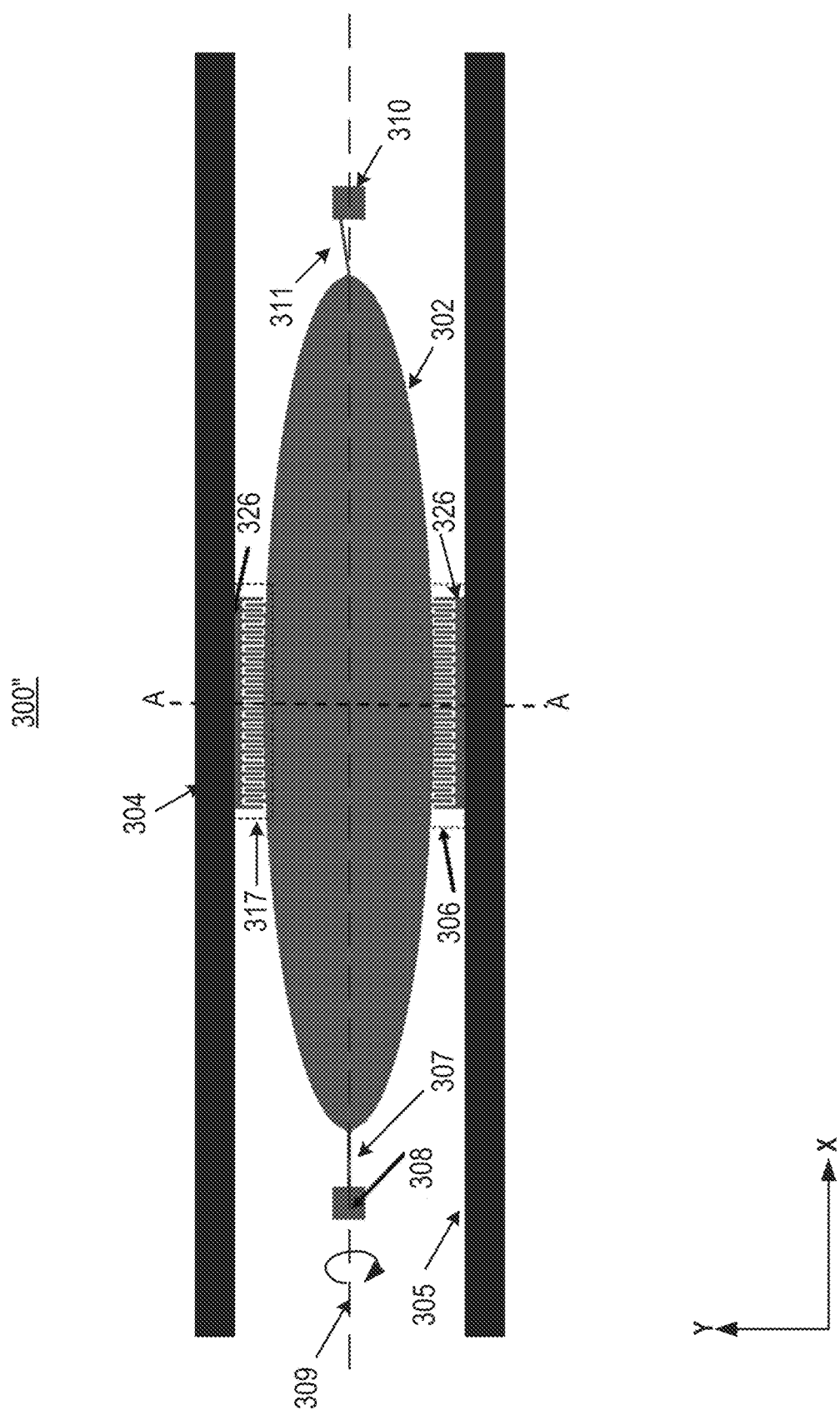
FIG. 3D illustrates a schematic diagram of another exemplary micromachined mirror assembly, according to embodiments of the disclosure.

The imbalanced state can also be created by introducing difference(s) to beams 307 and 311. FIG. 3D illustrates a schematic diagram of an exemplary micromachined mirror assembly 300" having asymmetrical beams, according to embodiments of the disclosure. As illustrated in FIG. 3D, beam 311 and beam 307 may be misaligned with each other along axis 309. For example, beam 311 may be attached to an off-center point of anchor 310, thereby misaligning with beam 307 that is attached to a center point of anchor 308. This misalignment can create asymmetry between the upper and lower parts of micro mirror 302 with respect to axis 309, so as to establish an imbalanced state. In another example, beams 307 and 311 may be include different materials such that the weights, flexibility, or other physical properties of the beams may be different. Such differences may also create asymmetry that leads to an imbalanced state. For instance, beam 311 may be thicker and heavier than beam 307. This weight imbalance may cause micro mirror 302 to slightly lean toward the direction of beam 311, thereby creating an imbalanced state of micro mirror 302 when no actuation force is applied thereon (e.g., when micro mirror is not yet driven by any actuator). Other approaches may also be used to create the imbalanced state. For instance, the lengths of the beams may be different, the weight distribution across micro mirror 302 may not be uniform, the shape of micro mirror 302 may not be symmetrical with respect to axis 309, etc.

The embodiments above are described using electrostatic actuation as an example. It is noted that the system, device, and method disclosed herein are also applicable to magnetic actuation cases. For example, when using magnetic actuators, the actuation force that drive micro mirror 302 is also an attracting force that pulls rotor 327 toward stator 326. Therefore, micro mirror systems driven by magnetic actuators can be similarly improved by the embodiments disclosed herein.

Figure 4:
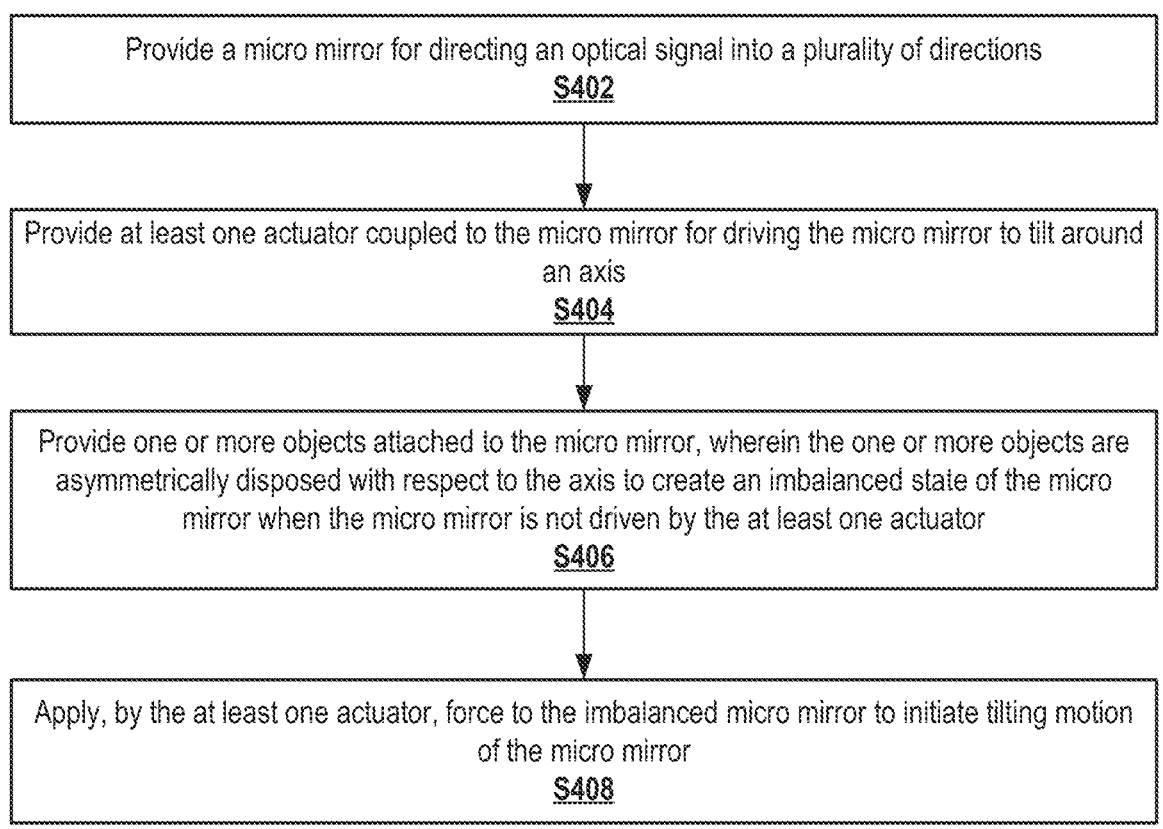
FIG. 4 illustrates a flow chart of an exemplary method for controlling a micromachined mirror assembly, according to embodiments of the disclosure.

FIG. 4 illustrates a flow chart of an exemplary method 400 for controlling a micromachined mirror assembly in an optical sensing system, according to embodiments of the disclosure. Method 400 may include steps S402-S408. It is to be appreciated that some of the steps may be optional to perform method 400. Further, some of the steps may be performed simultaneously, or in a different order than shown in FIG. 4.

In step S402, a micro mirror (e.g., micro mirror 302) is provided in a micromachined mirror assembly (e.g., micromachined mirror assembly 300, 300', or 300"). The micro mirror can be used for directing an optical signal (e.g., laser beam 207) into a plurality of directions. The micro mirror may be suspended over a substrate (e.g., substrate 320) by at least one beam (e.g., beam 307/311) mechanically coupled to the micro mirror. In some embodiments, the micro mirror may be suspended over the substrate by two beams (e.g., beams 307 and 311) mechanically coupled to the micro mirror, with one of the beams mechanically coupled to one end of the micro mirror, and the other beam mechanically coupled to an opposite end of the micro mirror.

In step S404, at least one actuator (e.g., actuator 316/317) is provided. The at least one actuator may be coupled to the micro mirror to drive the micro mirror to tilt around an axis (e.g., axis 309). The at least one actuator may include a stator (e.g., stator 326) and a rotor (e.g., rotor 327). The stator may be supported by a supporting structure (e.g., structure 304/305). The rotor may be on an edge of the micro mirror. Both the stator and the rotor may have a comb structure that includes a plurality of teeth. The teeth of the stator and the teeth of the rotor may be interleaved. The stator may receive an electrical signal to impose an attracting force to pull the rotor toward the stator, thereby causing the motion of the micro mirror.

In step S406, one or more objects (e.g., object 312, 312A, and/or 312B) attached to the micro mirror are provided. The one or more objects may be asymmetrically disposed with respect to the axis (e.g., axis 309) to create an imbalanced state of the micro mirror when the micro mirror is not driven by the at least one actuator. For example, the micro mirror may be in an initial imbalance condition due to the object(s) attached and is thus easy to start the tilting motion and enter the oscillation mode. In some embodiments, multiple objects may be distributed on opposite sides of the micro mirror and/or around a perimeter of the micro mirror. The objects may have the same or different sizes, weights, and/or compositions. In some embodiments, the beams that are mechanically coupled to the micro mirror may be used as the objects to create the imbalanced state.

In step S408, the at least one actuator may apply force to the imbalanced micro mirror to initiate tilting motion of the micro mirror. When the at least one actuator receives an electrical signal (e.g., V1/V2), it can cause the micro mirror to tilt correspondingly. Because the at least one object establishes an imbalanced state of the micro mirror, the micro mirror is in a position that can be instantly set in motion by the force. The motion can be subsequently amplified such that the micro mirror enters the oscillation mode. For example, the micro mirror moves towards and passes the plane of the stator, and continue to swing to a max angle. Then the pulling force can pull the micro mirror back towards the plane, causing the micro mirror to oscillate.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

What is claimed is:

1. A micromachined mirror assembly for controlling optical directions in an optical sensing system, the micromachined mirror assembly comprising:
    a micro mirror suspended over a substrate and configured to direct an optical signal into a plurality of directions;
    at least one actuator coupled to the micro mirror and configured to drive the micro mirror to tilt around an axis with respect to the substrate; and
    one or more objects attached to the micro mirror, wherein the one or more objects are asymmetrically disposed with respect to the axis to create an imbalanced state of the micro mirror, in which an initial tilting angle defined by the substrate and a plane containing the micro mirror is larger than a predetermined threshold, when the micro mirror is not driven by the at least one actuator.

2. The micromachined mirror assembly of claim 1, wherein the one or more objects comprise a first object attached to an edge of the micro mirror.

3. The micromachined mirror assembly of claim 1, wherein the one or more objects comprise a plurality of objects distributed around a perimeter of the micro mirror.

4. The micromachined mirror assembly of claim 3, wherein the plurality of objects have a same weight.

5. The micromachined mirror assembly of claim 3, wherein at least two of the plurality of objects have different weights.

6. The micromachined mirror assembly of claim 1, wherein the one or more objects comprise at least two beams attached to the micro mirror for suspending the micro mirror over the substrate.

7. The micromachined mirror assembly of claim 6, wherein the at least two beams are misaligned along the axis.

8. The micromachined mirror assembly of claim 6, wherein the at least two beams comprise different materials.

9. The micromachined mirror assembly of claim 1, wherein the at least one actuator includes an electrostatic actuator, a piezoelectric actuator, or a magnetic actuator.

10. The micromachined mirror assembly of claim 1, wherein the at least one actuator comprises a comb structure.

11. A method for controlling a micromachined mirror assembly in an optical sensing system, the method comprising:
    providing, in the micromachined mirror assembly, a micro mirror suspended over a substrate and for directing an optical signal into a plurality of directions;
    providing at least one actuator coupled to the micro mirror for driving the micro mirror to tilt around an axis with respect to the substrate;
    providing one or more objects attached to the micro mirror, wherein the one or more objects are asymmetrically disposed with respect to the axis to create an imbalanced state of the micro mirror, in which an initial tilting angle defined by the substrate and a plane containing the micro mirror is larger than a predetermined threshold, when the micro mirror is not driven by the at least one actuator; and
    applying, by the at least one actuator, force to the micro mirror in the imbalanced state to initiate tilting motion of the micro mirror.

12. The method of claim 11, wherein the one or more objects comprise a first object attached to an edge of the micro mirror.

13. The method of claim 11, wherein the one or more objects comprise a plurality of objects distributed asymmetrically around a perimeter of the micro mirror.

14. The method of claim 13, wherein the plurality of objects have a same weight.

15. The method of claim 13, wherein at least two of the plurality of objects have different weights.

16. The method of claim 11, wherein:
    the at least one actuator comprises an electrostatic actuator, a piezoelectric actuator, or a magnetic actuator; and
    applying the force to the micro mirror in the imbalanced state comprises applying electric, piezoelectric, or magnetic force to the micro mirror in the imbalanced state to initiate the tilting motion of the micro mirror.

17. An optical sensing system, comprising:
    a transmitter configured to emit an optical signal to scan an environment around the optical sensing system;

a receiver configured to detect a reflected optical signal from the environment; and a mirror assembly configured to control directions of the optical signal, the mirror assembly comprising:

a micro mirror suspended over a substrate and configured to direct the optical signal into a plurality of directions;

at least one actuator coupled to the micro mirror and configured to drive the micro mirror to tilt around an axis with respect to the substrate; and one or more objects attached to the micro mirror, wherein the one or more objects are asymmetrically disposed with respect to the axis to create an imbalanced state of the micro mirror, in which an initial tilting angle defined by the substrate and a plane containing the micro mirror is larger than a predetermined threshold, when the micro mirror is not driven by the at least one actuator.

18. The optical sensing system of claim 17, wherein the one or more objects comprise a first object attached to an edge of the micro mirror.

19. The optical sensing system of claim 17, wherein the one or more objects comprise a plurality of objects distributed around a perimeter of the micro mirror.

20. The optical sensing system of claim 17, wherein the at least one actuator comprises a comb structure.

* * * * *